US011132084B2

(12) United States Patent
Bai

(10) Patent No.: US 11,132,084 B2
(45) Date of Patent: Sep. 28, 2021

(54) TOUCH CIRCUIT, TOUCH DETECTION METHOD, DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventor: Aojun Bai, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 36 days.

(21) Appl. No.: 16/620,606

(22) PCT Filed: May 22, 2019

(86) PCT No.: PCT/CN2019/087985
§ 371 (c)(1),
(2) Date: Dec. 9, 2019

(87) PCT Pub. No.: WO2019/228240
PCT Pub. Date: Dec. 5, 2019

(65) Prior Publication Data
US 2020/0142564 A1    May 7, 2020

(30) Foreign Application Priority Data

May 31, 2018    (CN) .......................... 201810553991.4

(51) Int. Cl.
*G06F 3/041* (2006.01)
*G06F 3/044* (2006.01)
*H01L 27/32* (2006.01)

(52) U.S. Cl.
CPC ........ *G06F 3/04164* (2019.05); *G06F 3/0412* (2013.01); *G06F 3/0443* (2019.05); *G06F 3/0446* (2019.05); *H01L 27/323* (2013.01)

(58) Field of Classification Search
USPC ............ 345/173, 174, 156, 87, 75.2; 438/30
See application file for complete search history.

(56) References Cited

U.S. PATENT DOCUMENTS 7,145,528 B2 * 12/2006 Yabu ........................ G09G 3/22
345/75.2
9,153,629 B2    10/2015 Lee
(Continued)

FOREIGN PATENT DOCUMENTS

| CN | 101726890 | 6/2010 |
|----|-----------|--------|
| CN | 101930136 | 12/2010 |

(Continued)

OTHER PUBLICATIONS

International Search Report and Written Opinion dated Aug. 21, 2019 for PCT Patent Application No. PCT/CN2019/087985.
(Continued)

*Primary Examiner* — Thuy N Pardo
(74) *Attorney, Agent, or Firm* — Thomas | Horstemeyer, LLP

(57) ABSTRACT

The present disclosure generally relates to the field of display technologies and, more particularly, to a touch circuit, a touch detection method, a display panel, and a display device. The touch circuit includes a touch electrode, a touch signal line, and a driving transistor. The driving transistor has a control terminal coupled to the touch electrode, a first terminal receiving a first power signal, and a second terminal coupled to the touch signal line, and is configured to output a current signal to the touch signal line based on a voltage signal of the touch electrode.

10 Claims, 4 Drawing Sheets

(56) References Cited

U.S. PATENT DOCUMENTS

| | | | |
|---|---|---|---|
| 9,478,590 B2 | 10/2016 | Lee | |
| 9,727,186 B2 | 8/2017 | Yang | |
| 9,983,755 B2 | 5/2018 | Yang | |
| 10,055,057 B2 | 8/2018 | Kim et al. | |
| 10,185,431 B2 | 1/2019 | Kim et al. | |
| 10,248,249 B2* | 4/2019 | Liu | G02F 1/13318 |
| 10,262,597 B2 | 4/2019 | Yang et al. | |
| 2003/0151572 A1* | 8/2003 | Kumada | G09G 3/3614 345/87 |
| 2012/0038585 A1 | 2/2012 | Kim | |
| 2014/0192011 A1* | 7/2014 | Min | G06F 3/0445 345/174 |
| 2014/0256074 A1* | 9/2014 | Kim | G06F 3/0443 438/30 |
| 2015/0002462 A1* | 1/2015 | Zhao | G02F 1/13338 345/174 |
| 2015/0048346 A1 | 2/2015 | Lee | |
| 2016/0041664 A1* | 2/2016 | Qin | G06F 3/04166 345/173 |
| 2016/0246409 A1 | 8/2016 | Yang | |
| 2016/0246429 A1* | 8/2016 | Ma | G06F 3/04184 |
| 2016/0291752 A1 | 10/2016 | Li et al. | |
| 2017/0031485 A1 | 2/2017 | Kim et al. | |
| 2017/0038898 A1 | 2/2017 | Kim et al. | |
| 2017/0046006 A1 | 2/2017 | Kim et al. | |
| 2017/0075488 A1* | 3/2017 | Lai | G06F 3/04164 |
| 2017/0108987 A1* | 4/2017 | Park | G06F 3/0446 |
| 2017/0162121 A1 | 6/2017 | Yang et al. | |
| 2017/0186773 A1* | 6/2017 | Fan | G06F 3/0412 |
| 2017/0249036 A1* | 8/2017 | Lin | G09G 3/3648 |
| 2018/0004323 A1 | 1/2018 | Yang | |
| 2018/0275795 A1 | 9/2018 | Takahashi | |
| 2018/0329570 A1* | 11/2018 | Chan | G06F 3/04184 |
| 2018/0348922 A1* | 12/2018 | Luo | G06F 3/04184 |
| 2018/0348938 A1* | 12/2018 | Ding | G06F 3/03545 |
| 2019/0181186 A1* | 6/2019 | Lee | H01L 51/5253 |
| 2020/0105219 A1* | 4/2020 | Fujikawa | G09G 3/3614 |
| 2020/0210000 A1* | 7/2020 | Fukushima | G06F 3/04166 |
| 2020/0233518 A1* | 7/2020 | Park | G06F 3/0446 |
| 2020/0233524 A1* | 7/2020 | Ikeda | G06F 3/0416 |

FOREIGN PATENT DOCUMENTS

| | | |
|---|---|---|
| CN | 103488362 | 1/2014 |
| CN | 103500040 | 1/2014 |
| CN | 104091563 | 10/2014 |
| CN | 104699318 | 6/2015 |
| CN | 104835449 | 8/2015 |
| CN | 106406591 | 2/2017 |
| CN | 106409218 | 2/2017 |
| CN | 106448558 | 2/2017 |
| CN | 106468981 | 3/2017 |
| CN | 106547384 | 3/2017 |
| CN | 106708342 | 5/2017 |
| CN | 106980410 A | 7/2017 |
| CN | 108415624 | 8/2018 |
| CN | 108628501 | 10/2018 |
| CN | 106980410 B | 6/2019 |
| EP | 3125226 A1 | 2/2017 |
| EP | 3128401 A2 | 2/2017 |
| EP | 3130987 A2 | 2/2017 |
| EP | 3130987 A3 | 3/2017 |
| EP | 3128401 A3 | 4/2017 |
| EP | 3125226 B1 | 2/2019 |
| EP | 3130987 B1 | 2/2019 |
| WO | 2018177185 | 10/2018 |

OTHER PUBLICATIONS

1st Office Action dated Aug. 19, 2019 for Chinese Patent Application No. 201810553991.4.

2nd Office Action dated Jan. 17, 2020 for Chinese Patent Application No. 201810553991.4.

* cited by examiner

TOUCH CIRCUIT, TOUCH DETECTION METHOD, DISPLAY PANEL AND DISPLAY DEVICE

CROSS-REFERENCE TO RELATED APPLICATIONS

The present disclosure is based upon International Application No. PCT/CN2019/087985, filed on May 22, 2019, which is based upon and claims priority to Chinese Patent Application No. 201810553991.4, filed on May 31, 2018, titled "TOUCH CIRCUIT, TOUCH DETECTION METHOD, DISPLAY PANEL AND DISPLAY DEVICE", and the entire contents thereof are incorporated herein by reference.

TECHNICAL FIELD

The present disclosure generally relates to the field of display technologies, and more particularly, to a touch circuit, a touch detection method, a display panel, and a display device.

BACKGROUND

Touch technology includes self-capacitive touch technology and mutual-capacitive touch technology. Among them, self-capacitive touch technology, due to its simple structure, is widely used in various display technology fields, such as the display technology fields of OLED and AMOLED display devices.

In the related art, a self-capacitive touch circuit generally includes a touch signal line and a touch electrode. When a touch subject (such as a finger) approaches the touch electrode, a voltage on the touch electrode is changed due to capacitive coupling. A position where the touch subject touches may be determined according to a voltage change on the touch electrode sensed by the touch signal line.

However, a voltage signal on the touch electrode may be attenuated when being transmitted through the touch signal line. As the size of a display panel becomes larger, the length of the touch signal line is required to be longer. The longer the touch signal line is, the more serious the effect on the detection of the voltage change of the touch electrode the touch signal line may have, thereby affecting accuracy of touch detection.

It is to be noted that the above information disclosed in this Background section is only for enhancement of understanding of the background of the present disclosure and therefore, it may contain information that does not form the prior art that is already known to a person of ordinary skill in the art.

SUMMARY

In an aspect of embodiments of the present disclosure, a touch circuit is provided. The touch circuit includes a touch electrode, a touch signal line, and a driving transistor. The driving transistor has a control terminal coupled to the touch electrode, a first terminal receiving a first power signal, and a second terminal coupled to the touch signal line, and is configured to output a current signal to the touch signal line based on a voltage signal of the touch electrode.

According to an embodiment of the present disclosure, the touch circuit further includes at least one first switching transistor. The first switching transistor has a control terminal receiving a first control signal, a first terminal coupled to the touch electrode, and a second terminal receiving a second power signal, and is configured to charge the touch electrode with the second power signal in response to the first control signal.

According to an embodiment of the present disclosure, the touch circuit further includes a capacitor element. The capacitor element has a first terminal coupled to the control terminal of the driving transistor, and a second terminal receiving a second control signal.

According to an embodiment of the present disclosure, the touch circuit further includes at least one second switching transistor. The second switching transistor has a control terminal receiving a third control signal, a first terminal coupled to the touch electrode, and a second terminal receiving the second power signal, and is configured to charge the touch electrode with the second power signal in response to the third control signal.

According to an embodiment of the present disclosure, the touch circuit is provided on a display panel including a gate driving circuit. The first control signal, the second control signal, and the third control signal share a scan signal provided by the gate driving circuit. A driving timing of the second control signal is earlier than that of the third control signal and later than that of the first control signal.

In another aspect of embodiments of the present disclosure, a display panel is further provided including the touch circuit described above.

According to an embodiment of the present disclosure, the display panel further includes a plurality of driving electrodes extending along a first direction and spaced apart from each other along a second direction. Each of the driving electrodes includes a plurality of first electrode blocks and second electrode blocks arranged alternately and spaced apart from each other. The first electrode block is used as the touch electrode, and the second electrode block is configured to provide a power signal to a driving circuit of the display panel and to further provide the second power signal.

According to an embodiment of the present disclosure, a plurality of touch circuits disposed on a same one of the driving electrodes are coupled to a same touch signal line.

According to an embodiment of the present disclosure, a size of each of the touch electrodes in the first direction varies in the second direction.

In yet another aspect of embodiments of the present disclosure, a touch detection method is further provided for the touch circuit described above, including: charging the touch electrode; converting a voltage signal of the driving electrode into a current signal by using the driving transistor; and determining a touch position according to the current signal.

In yet another aspect of embodiments of the present disclosure, a display device is further provided including the display panel described above.

It is to be understood that the above general description and the detailed description below are merely exemplary and explanatory, and do not limit the present disclosure.

BRIEF DESCRIPTION OF THE DRAWINGS

The accompanying drawings herein are incorporated into and constitute a part of this specification, illustrate embodiments conforming to the present disclosure and together with the description serve to explain principles of the present disclosure. Understandably, the accompanying drawings in the following description show merely some embodiments of the present disclosure, and persons of ordinary skill in the FIG. 1 is a schematic structural diagram of a touch circuit according to an exemplary embodiment of the present disclosure.

DETAILED DESCRIPTION

Figure 1:
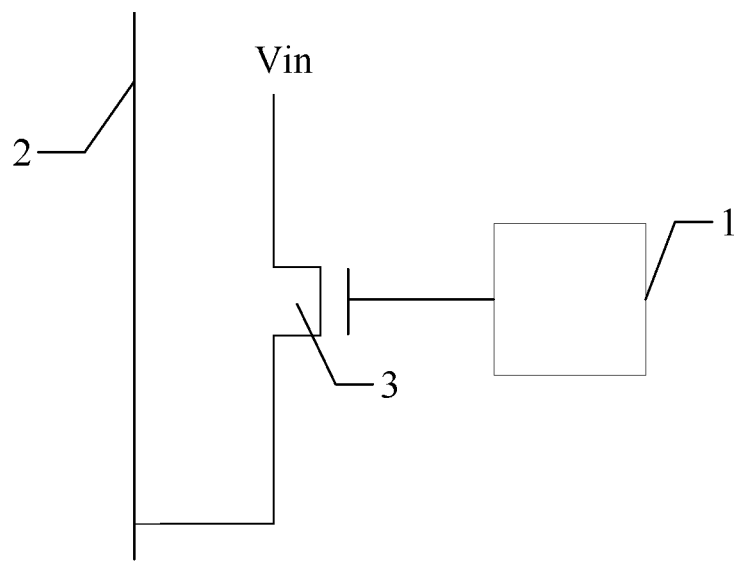

Example embodiments will be described more comprehensively by referring to accompanying drawings now. However, the example embodiments can be embodied in many forms and should not be construed as being limited to embodiments set forth herein; rather, these embodiments are provided so that the present disclosure will be made thorough and complete, and the concept of the example embodiments will be fully conveyed to those skilled in the art. The same reference numerals in the drawings denote the same or similar structures and thus, repeated description thereof will be omitted.

Although relative terms such as "upper" and "lower" are used in this specification to describe relative relationship between one component and another component shown, these terms are used in this specification only for convenience, for example, according to directions of examples shown in the drawings. It can be understood that if a device shown is turned upside down, an "upper" component described will become a "lower" component. Other relative terms, such as "high", "low", "top", "bottom", "left", and "right" have similar meanings. When a structure is "on" another structure, it may refer to that the structure is integrally formed on the other structure, or that the structure is "directly" arranged on the other structure, or that the structure is "indirectly" arranged on the other structure through another structure.

The terms "a", "an", and "the" are used to indicate the presence of one or more elements/components/etc. The terms "including" and "having" are used in an open-ended manner, and refer to that there may be additional elements/components/etc. in addition to the listed elements/components/etc.

This exemplary embodiment first provides a touch circuit. FIG. 1 is a schematic structural diagram of a touch circuit according to an exemplary embodiment of the present disclosure and, as shown in FIG. 1, the touch circuit includes a touch electrode 1, a touch signal line 2, and a driving transistor 3. A control terminal of the driving transistor 3 is coupled to the touch electrode 1, a first terminal of the driving transistor 3 is configured to receive a first power signal Vin, and a second terminal of the driving transistor is coupled to the touch signal line to output a current signal to the touch signal line according to a voltage signal of the touch electrode.

In this exemplary embodiment, the driving transistor may be either a P-channel thin film transistor or an N-channel thin film transistor. The present exemplary embodiment will be described by taking the P-channel thin film transistor as an example. The first terminal of the driving transistor 3 is a source electrode, the second terminal is a drain electrode, and the control terminal is a gate electrode. The source electrode of the driving transistor 3 is configured to receive the first power signal Vin, the drain electrode of the driving transistor 3 is coupled to the touch signal line 2, and the gate electrode of the driving transistor 3 is coupled to the touch electrode. When the touch circuit is in operation, the driving transistor 3 operates in a saturation region, and an output current from the drain electrode of the driving transistor 3 is $Iout=k(Vgs-Vth)^2=k(Vg-Vs-Vth)^2$, where Vg is a gate voltage of the driving transistor 3, Vs is a source voltage of the driving transistor 3, k is a mobility of the driving transistor 3, and Vth is a threshold voltage of the driving transistor 3. In this exemplary embodiment, Vg is equal to the voltage of the touch electrode, Vs is equal to Vin, and k and Vth are constant values. Therefore, it can be seen that the output current Iout from the drain electrode of the driving transistor 3 is only related to the voltage of the touch electrode, and a voltage change of the touch electrode can be determined based on the output current Iout from the drain electrode of the driving transistor 3. However, when a touch subject (such as a finger) approaches the touch electrode, the voltage of the touch electrode is changed. Therefore, a touch on the touch electrode can be detected by detecting the output current Iout from the drain electrode of the driving transistor 3.

In the touch circuit provided by the embodiments of the present disclosure, a voltage signal of a touch electrode is converted into a current signal through a driving transistor. On one hand, it avoids an attenuation of a voltage signal on the touch electrode when being transmitted through a touch line, thereby improving accuracy of touch detection. On the other hand, the touch circuit has a simple structure and low cost.

Figure 2:
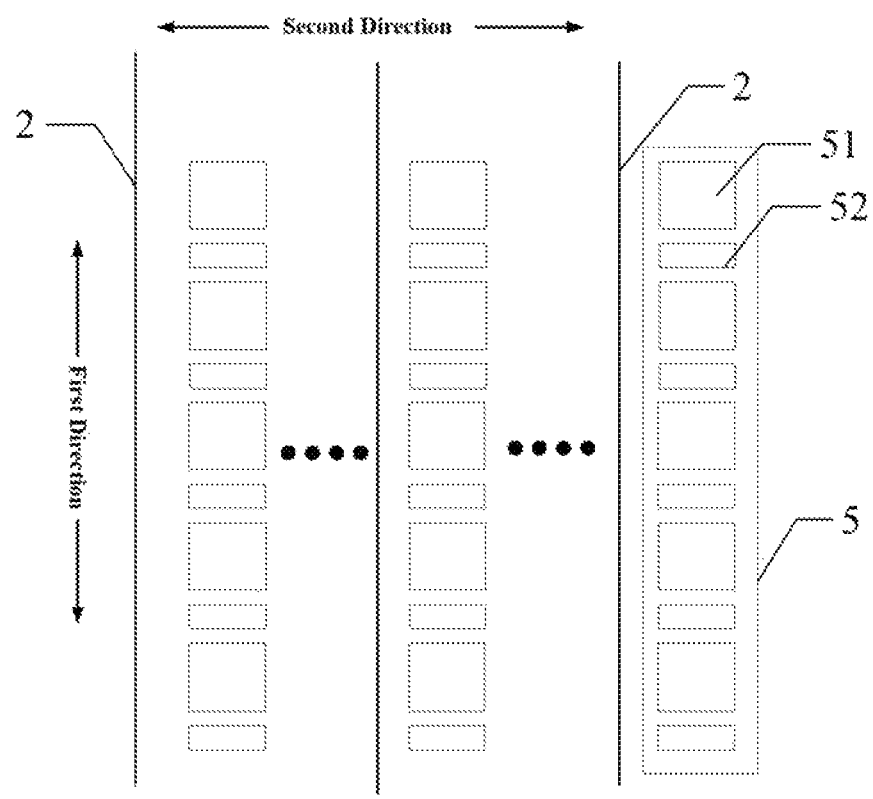
FIG. 2 is a schematic structural diagram of a display panel according to an exemplary embodiment of the present disclosure.
Figure 3:
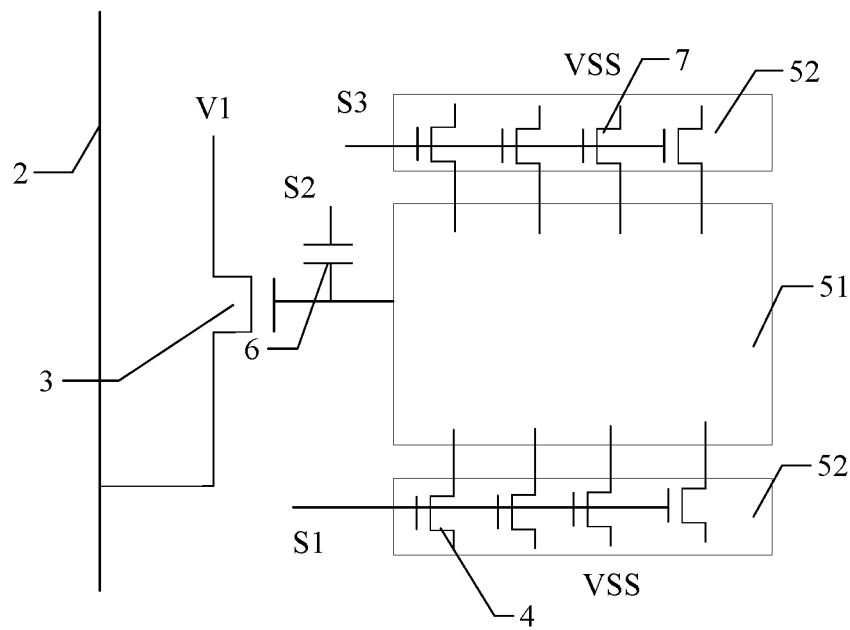
FIG. 3 is a circuit diagram of a touch circuit in a display panel according to an exemplary embodiment of the present disclosure.

The exemplary embodiment further discloses a display panel including the touch circuit described above. Specifically, FIG. 2 is a schematic structural diagram of a display panel according to an exemplary embodiment of the present disclosure, and FIG. 3 is a circuit diagram of a touch circuit in a display panel according to an exemplary embodiment of the present disclosure. As shown in FIGS. 2 and 3, the display panel may include a plurality of driving electrodes 5 extending along a first direction and spaced apart from each other along a second direction. Each of the driving electrodes 5 may include a plurality of first electrode blocks 51 and second electrode blocks 52 arranged alternately and spaced apart from each other. The first electrode block 51 may be used as the touch electrode 1, and the second electrode block 52 is configured to provide a power signal to a driving circuit of the display panel. The driving electrode 5 may be a cathode or an anode. In this exemplary embodiment, it is illustrated by taking that the driving electrode 5 is used as the cathode. All the second electrode blocks 52 in the display panel are electrically coupled and have an output voltage VSS.

In the display panel provided in the present exemplary embodiment, the first electrode blocks share the touch electrode. On one hand, such arrangement reduces the number of crossing-nodes of wires, thereby reducing parasitic capacitance between the wires and improving display effect. On the other hand, such arrangement avoids disposing additional touch layers, which reduces the number of wirings, simplifies processes, and saves costs.

In this exemplary embodiment, as shown in FIG. 3, the touch circuit may further include at least one first switching transistor 4. A control terminal of the first switching transistor 4 receives a first control signal S1, a first terminal of the first switching transistor 4 is coupled to the first electrode block 51, and a second terminal of the first switching transistor 4 receives a second power signal. The first switching transistor 4 is configured to charge the first electrode block 51 with the second power signal in response to the first control signal S1.

As shown in FIG. 3, the touch circuit may further include a capacitor element 6 in order to perform a touch detection in a preset period. A first terminal of the capacitor element 6 is coupled to the control terminal of the driving transistor 3, and a second terminal of the capacitor element 6 receives a second control signal S2. The first switching transistor 4 may be disposed on the second electrode block 52, and the second power source signal may be provided by the second electrode block 52. At this time, a voltage of the second power source signal is VSS, and the first electrode block 51 is at a voltage VSS when being charged with the second power signal. The first switching transistor 4 may be a P-channel thin film transistor, the second power signal provided by the second electrode block 52 may be greater than a threshold voltage of the first switching transistor 4, and the second control signal S2 may be a pulse signal.

When the second control signal S2 is at a high level, a voltage at the control terminal of the driving transistor 3 is equal to VSS. At this time, the driving transistor is not turned on and the touch circuit does not perform touch detection. When the second control signal S2 is at a low level, the first terminal of the capacitor element 6 has a voltage drop due to a voltage drop at the second terminal, so that the control terminal of the driving transistor 3 coupled to the first terminal of the capacitor element 6 also has a voltage drop. At this time, a voltage at the control terminal of the driving transistor 3 is lower than the threshold voltage of the first switching transistor 4, and the driving transistor 3 is turned on, so that the touch circuit performs touch detection. In the present exemplary embodiment, the touch detection may be controlled according to a time period by disposing the capacitor element 6. It should be understood that, in other exemplary embodiments, the driving electrode 5 may also be an anode, the driving transistor may be an N-channel thin film transistor, the first switching transistor 4 may be an N-channel thin film transistor, and the second power signal provided by the second electrode block 52 may be smaller than the threshold voltage of the first switching transistor 4, which all belong within the scope of protection of the present disclosure.

In this exemplary embodiment, as shown in FIG. 3, during a touch detection phase of the touch circuit, the first electrode block 51 will release charges, and the voltage of the first electrode block 51 will change. Since the first electrode block 51 and the second electrode block 52 form a capacitor structure, a voltage change of the first electrode block 51 will affect the voltage of the second electrode block 52, and as a result, the display panel displays abnormally. In this exemplary embodiment, the touch circuit further includes at least one second switching transistor 7. A control terminal of the second switching transistor 7 receives a third control signal S3, a first terminal of the second switching transistor 7 is coupled to the first electrode block 51, and a second terminal of the second switching transistor 7 can receive the second power signal. The second switching transistor is configured to charge the first electrode block 51 with the second power signal in response to the third control signal. The first electrode block 51 is charged with the second power signal in response to the third control signal after the discharging of the first electrode block 51 is completed, so that the voltages of the first electrode block 51 and the second electrode block 52 are the same, and the first electrode block 51 does not affect normal display.

In this exemplary embodiment, the first control signal S1, the second control signal S2, and the third control signal S3 may share a scan signal provided by a gate driving circuit in the display panel. A driving timing of the second control signal S2 is earlier than that of the third control signal S3 and later than that of the first control signal S1. In the display panel, the gate driving circuit generates scan signals to the pixel driving circuit row by row according to a time sequence. The first control signal S1 may share the scan signal of pixels in a previous row, the second control signal S2 may share the scan signal of pixels in a middle row, and the third control signal S3 may share the scan signal of pixels in a next row. The pixels in the previous row, the pixels in the middle row, and the pixels in the next row refer to three rows of pixels having a relative position in the display panel, and the three rows of pixels may be adjacent or spaced apart from each other. In this exemplary embodiment, the first control signal S1, the second control signal S2, and the third control signal S3 of the touch circuit share a scanning signal provided by the gate driving circuit, which can allow touch control to be performed in synchronization with display. Therefore, it is not necessary to set a touch period separately, thereby increasing display time. Such setting avoids a technical problem in the related art that service life of the display panel is short since a normal display is supported by increasing luminance of light emitting elements due to short display time.

Figure 4:
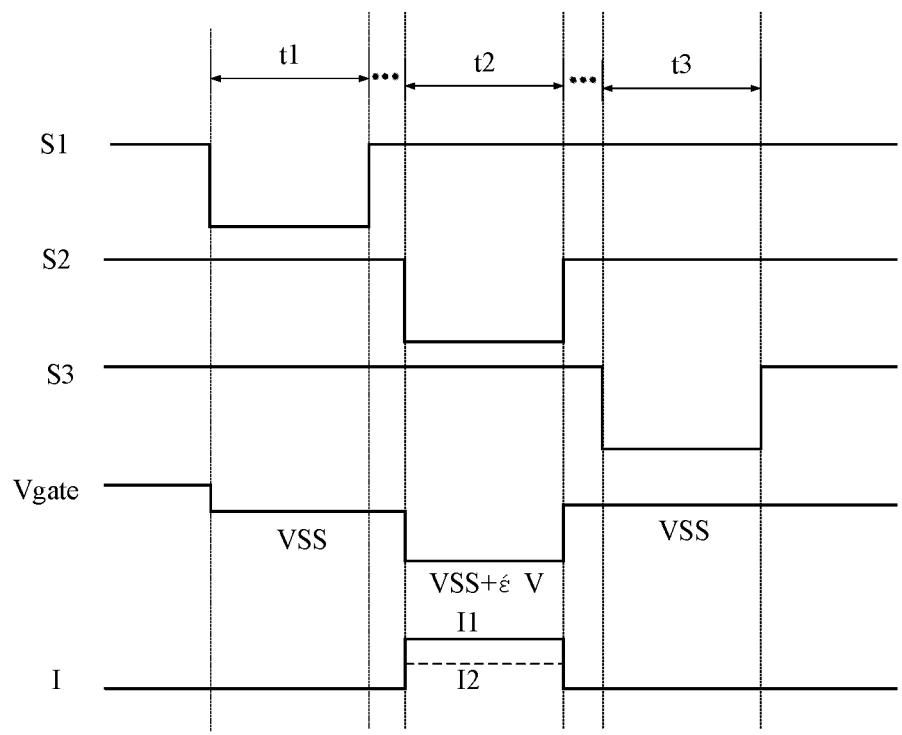
FIG. 4 is a timing diagram of a control signal of a touch circuit according to an exemplary embodiment of the present disclosure.

FIG. 4 is a timing diagram of control signals in a touch circuit according to an exemplary embodiment of the present disclosure. As shown in FIG. 4, in period t1, S1 is at a low level, S2 is at a high level, and S3 is at a high level. During this period, the first switching transistor is turned on, the second switching transistor is turned off, and the first electrode block 51 is charged to be at VSS with the second power signal. Since VSS is greater than the threshold voltage of the first switching transistor 4, the driving transistor is turned off, and the output current from the driving transistor is Iout=0. During period t2, S1 is at a high level, S2 is at a low level, and S3 is at a high Level. During this period, the first switching transistor is turned off, the second switching transistor is turned off, and the first terminal of the capacitor element 6 has a voltage drop due to the voltage drop of the second terminal, so that the voltage Vgate of the control terminal of the driving transistor 3 coupled to the first terminal of the capacitor element 6 is dropped to VSS+ΔV, where ΔV is a voltage variation of the second control signal. At this time, the voltage at the control terminal of the driving transistor is less than the threshold voltage of the first switching transistor 4, and the driving transistor 3 is turned on. When no touch control occurs, the driving transistor 3 outputs a current I=I1, and when a touch control occurs, the driving transistor 3 outputs a current I=I2. During period t3, S1 is at a high level, S2 is at a high level, and S3 is at a low level. The first switching transistor 4 is turned off, the second switching transistor 7 is turned on, and the touch electrode 1 is charged to be at VSS with the second power signal.

Figure 5:
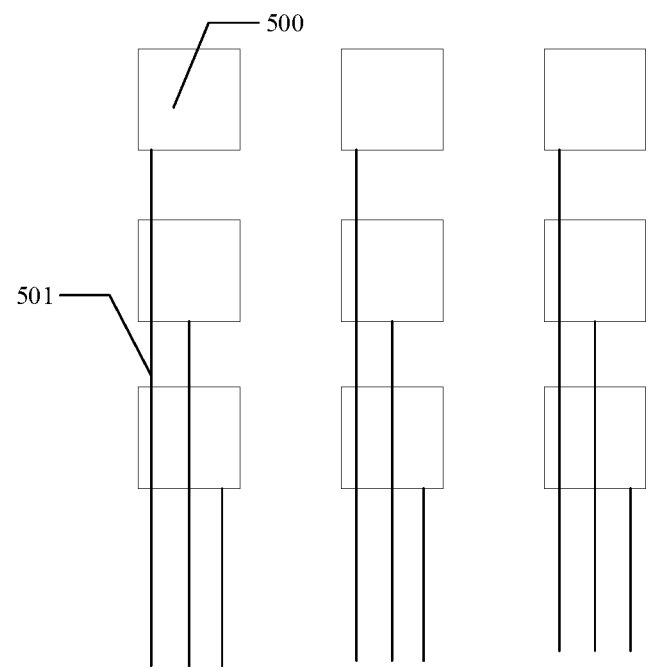
FIG. 5 is a schematic structural diagram of a touch circuit of a display panel in the related art.

FIG. 5 is a schematic structural diagram of a touch circuit of a display panel in the related art. Each touch electrode 500 is coupled to one detection line 501. In this exemplary embodiment, as shown in FIG. 2, a plurality of touch circuits provided on a same driving electrode 5 may be coupled to a same touch signal line 2. Such arrangement can reduce the number of pins of a detection unit coupled to the touch signal line, and reduce the cost of the detection unit.

Figure 6:
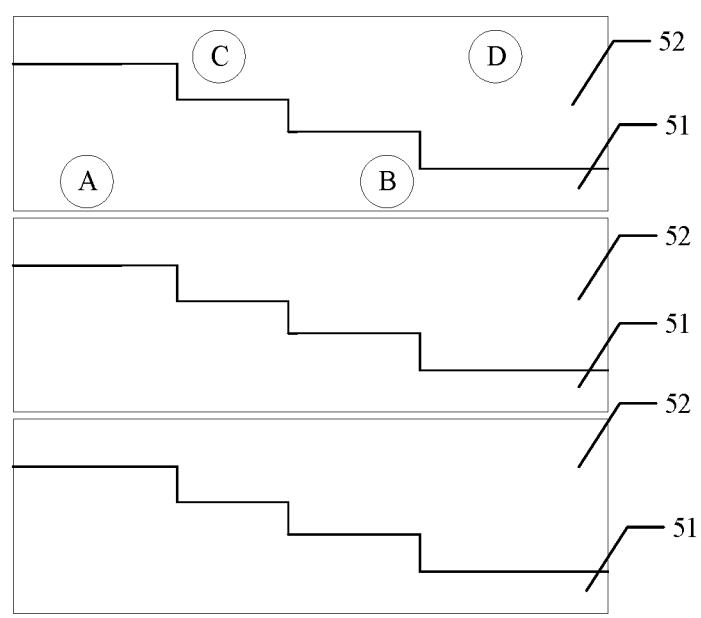
FIG. 6 is a schematic structural diagram of a touch electrode in a display panel according to an exemplary embodiment of the present disclosure.

In this exemplary embodiment, if the size of a driving electrode of the display panel in the second direction is relatively large and a touch area is smaller than the size of the driving electrode in the second direction, it is difficult to determine a specific location of the touch area over the driving electrode along the second direction. In this exemplary embodiment, as shown in FIG. 6, which is a schematic structural diagram of a touch electrode in a display panel according to an exemplary embodiment of the present disclosure, the size of each of the touch electrodes (i.e., the first electrode block 51) in the first direction changes along the second direction. In FIG. 6, there are two touch points A and B on the first electrode block 51. The area around a touch point A is larger than the area around a touch point B. When the two points A and B are touched, different capacitance changes occur on the first electrode block 51. Specific touch positions can be obtained through the different capacitance changes. In FIG. 6, there are two touch points C and D on the second electrode block 52. The touch point C is closer to the first electrode block 51, and the touch point D is farther from the first electrode block 51. When the points C and D are touched, different capacitance changes occur on the first electrode block 51, and specific touch positions can be obtained through the different capacitance changes. Therefore, such arrangement can improve touch accuracy. In FIG. 6, the size of the first electrode block 51 in the first direction changes stepwise along the second direction. It should be understood that there are more ways to change the size, in the first direction, of the first electrode block 51 along the second direction, which all belong within the scope of protection of the present disclosure.

Figure 7:
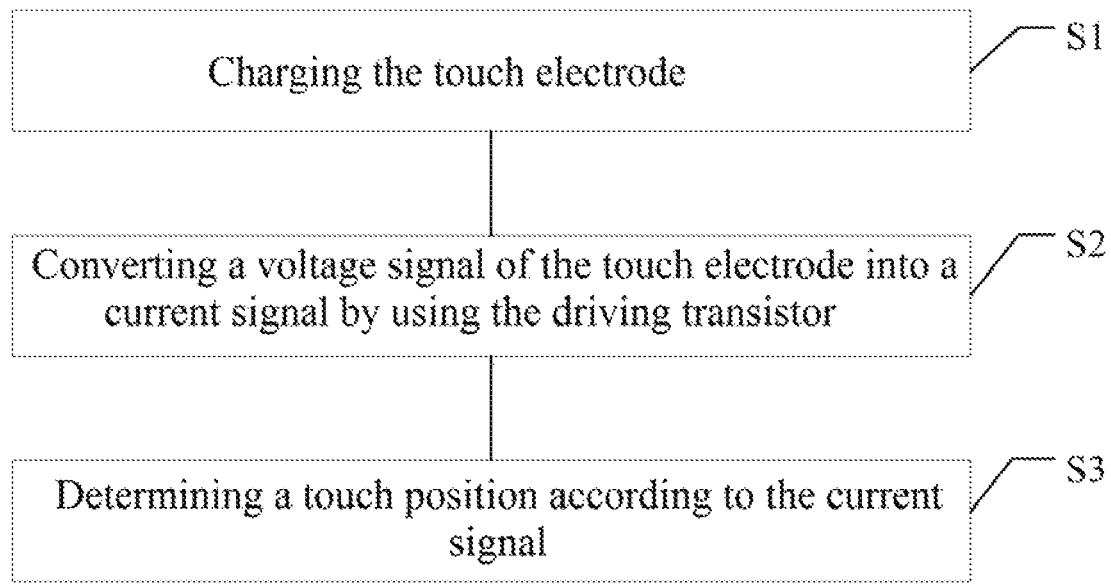
FIG. 7 is a flowchart of a touch detection method according to an exemplary embodiment of the present disclosure.

This exemplary embodiment also provides a touch detection method, which is applied to the above touch circuit. FIG. 7 is a flowchart of a touch detection method according to an exemplary embodiment of the present disclosure. As shown in FIG. 7, the method includes the following steps.

At S1, the touch electrode is charged.

At S2, a voltage signal of the touch electrode is converted into a current signal by using the driving transistor.

At S3, a touch position is determined according to the current signal.

The touch detection method provided in this exemplary embodiment has the same technical features and working principles as the touch circuit described above, and the above content has been described in detail, and is not repeated herein.

The present disclosure also provides a display device including the above display panel.

In this exemplary embodiment, the specific type of the display device is not particularly limited, and may be any type of display device commonly used in the art, such as an OLED display. The display device provided in this exemplary embodiment has the same technical features and working principles as the display panel described above, and the above content has been described in detail, and is not repeated here.

Those skilled in the art will readily contemplate other embodiments of the present disclosure after considering the specification and practicing the disclosure disclosed herein. This application is intended to cover any variations, uses, or adaptations of this disclosure that conform to the general principles of this disclosure and include the common knowledge or conventional technical means in the technical art which are not disclosed in this disclosure. It is intended that the specification and examples be considered as exemplary only, with a true scope and spirit of the disclosure being indicated by the following claims.

It should be understood that the present disclosure is not limited to the precise structure that has been described above and illustrated in the drawings, and various modifications and changes can be made without departing from the scope thereof. The scope of the disclosure is limited only by the following claims.

What is claimed is:

1. A touch circuit, comprising:
   a touch electrode;
   a touch signal line;
   a driving transistor having a control terminal coupled to the touch electrode, a first terminal receiving a first power signal, and a second terminal coupled to the touch signal line, and the driving transistor being configured to output a current signal to the touch signal line based on a voltage signal of the touch electrode;
   at least one first switching transistor having a control terminal receiving a first control signal, a first terminal coupled to the touch electrode, and a second terminal receiving a second power signal, and configured to charge the touch electrode with the second power signal in response to the first control signal;
   a capacitor element having a first terminal coupled to the control terminal of the driving transistor, and a second terminal receiving a second control signal;
   at least one second switching transistor having a control terminal receiving a third control signal, a first terminal coupled to the touch electrode, and a second terminal receiving the second power signal, and configured to charge the touch electrode with the second power signal in response to the third control signal, wherein:
   the touch circuit is provided on a display panel comprising a gate driving circuit;
   the first control signal, the second control signal, and the third control signal share a scan signal provided by the gate driving circuit; and
   a driving timing of the second control signal is earlier than that of the third control signal and later than that of the first control signal.

2. A touch detection method for the touch circuit according to claim 1, comprising:
   charging the touch electrode;
   converting a voltage signal of the touch electrode into a current signal by using the driving transistor; and
   determining a touch position according to the current signal.

3. A display panel comprising a touch circuit and a gate driving circuit, wherein the touch circuit comprises:
   a touch electrode;
   a touch signal line;
   a driving transistor having a control terminal coupled to the touch electrode, a first terminal receiving a first power signal, and a second terminal coupled to the touch signal line, and the driving transistor being configured to output a current signal to the touch signal line based on a voltage signal of the touch electrode;
   at least one first switching transistor having a control terminal receiving a first control signal, a first terminal coupled to the touch electrode, and a second terminal receiving a second power signal, and configured to charge the touch electrode with the second power signal in response to the first control signal;

a capacitor element having a first terminal coupled to the control terminal of the driving transistor, and a second terminal receiving a second control signal;

at least one second switching transistor having a control terminal receiving a third control signal, a first terminal coupled to the touch electrode, and a second terminal receiving the second power signal, and configured to charge the touch electrode with the second power signal in response to the third control signal, wherein:

the touch circuit is provided on the display panel;

the first control signal, the second control signal, and the third control signal share a scan signal provided by the gate driving circuit; and a driving timing of the second control signal is earlier than that of the third control signal and later than that of the first control signal.

4. The display panel according to claim 3, further comprising a plurality of driving electrodes extending along a first direction and spaced apart from each other along a second direction, wherein:

each of the driving electrodes comprises a plurality of first electrode blocks and second electrode blocks arranged alternately and spaced apart from each other;

the first electrode block is used as the touch electrode; and the second electrode block is configured to provide a power signal to a driving circuit of the display panel.

5. The display panel according to claim 4, wherein a plurality of touch circuits coupled to a same one of the driving electrodes share a same touch signal line.

6. The display panel according to claim 4, wherein a size of each of the touch electrodes in the first direction varies in the second direction.

7. A display device comprising a display panel having a touch circuit and a gate driving circuit, wherein the touch circuit comprises:

a touch electrode;

a touch signal line;

a driving transistor having a control terminal coupled to the touch electrode, a first terminal receiving a first power signal, and a second terminal coupled to the touch signal line, and the driving transistor being configured to output a current signal to the touch signal line based on a voltage signal of the touch electrode;

at least one first switching transistor having a control terminal receiving a first control signal, a first terminal coupled to the touch electrode, and a second terminal receiving a second power signal, and configured to charge the touch electrode with the second power signal in response to the first control signal;

a capacitor element having a first terminal coupled to the control terminal of the driving transistor, and a second terminal receiving a second control signal;

at least one second switching transistor having a control terminal receiving a third control signal, a first terminal coupled to the touch electrode, and a second terminal receiving the second power signal, and configured to charge the touch electrode with the second power signal in response to the third control signal, wherein:

the touch circuit is provided on the display panel;

the first control signal, the second control signal, and the third control signal share a scan signal provided by the gate driving circuit; and a driving timing of the second control signal is earlier than that of the third control signal and later than that of the first control signal.

8. The display device according to claim 7, wherein the display panel further comprises a plurality of driving electrodes extending along a first direction and spaced apart from each other along a second direction, wherein:

each of the driving electrodes comprises a plurality of first electrode blocks and second electrode blocks arranged alternately and spaced apart from each other; and the first electrode block is used as the touch electrode, and the second electrode block is configured to provide a power signal to a driving circuit of the display panel.

9. The display device according to claim 7, wherein a plurality of touch circuits coupled to a same one of the driving electrodes share a same touch signal line.

10. The display device according to claim 7, wherein a size of each of the touch electrodes in the first direction varies in the second direction.

* * * * *